US007715238B2

United States Patent
Lee et al.

(10) Patent No.: US 7,715,238 B2
(45) Date of Patent: May 11, 2010

(54) METHOD OF OPERATING NON-VOLATILE MEMORY DEVICE

(75) Inventors: Hee Youl Lee, Icheon-si (KR); Won Sic Woo, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 153 days.

(21) Appl. No.: 12/147,165

(22) Filed: Jun. 26, 2008

(65) Prior Publication Data

US 2009/0168510 A1   Jul. 2, 2009

(30) Foreign Application Priority Data

Dec. 27, 2007 (KR) ............... 10-2007-0138681

(51) Int. Cl.
 *G11C 11/00* (2006.01)
(52) U.S. Cl. .............. 365/185.2; 365/185.18; 365/185.19; 365/185.24
(58) Field of Classification Search .............. 365/185.2, 365/185.18, 185.19, 185.24
 See application file for complete search history.

(56) References Cited

U.S. PATENT DOCUMENTS 7,400,537 B2 *  7/2008  Hemink et al. ......... 365/185.29
7,486,564 B2 *  2/2009  Hemink et al. ......... 365/185.22
7,606,071 B2 * 10/2009  Sekar et al. ............ 365/185.17

* cited by examiner

*Primary Examiner*—Pho M. Luu
(74) *Attorney, Agent, or Firm*—Marshall, Gerstein & Borun LLP

(57) ABSTRACT

An operation of a non-volatile memory device. A method of operating a non-volatile memory device in accordance with an aspect of the present invention, a first program operation is performed by applying a first program voltage to word lines of memory cells, constituting a memory block. As a result of the first program operation, threshold voltages of the memory cells are firstly measured. A second program operation is performed using a second program voltage, which is increased as much as a difference between a first threshold voltage, that is, a lowest voltage level of the firstly measured threshold voltages and a second threshold voltage, that is, an intermediate voltage level of the firstly measured threshold voltages. The second program operation is repeatedly performed by increasing the second program voltage as much as the difference between the first and second threshold voltages until the lowest threshold voltage becomes higher than a program verify voltage. A pass voltage is then set by reflecting a first voltage level, that is, a difference between a program voltage applied in a last program execution step and the first program voltage.

12 Claims, 5 Drawing Sheets

METHOD OF OPERATING NON-VOLATILE MEMORY DEVICE

CROSS-REFERENCES TO RELATED APPLICATION

The present application claims priority to Korean patent application number 10-2007-0138681, filed on Dec. 27, 2007, which is incorporated by reference in its entirety.

BACKGROUND OF THE INVENTION

The present invention relates to programming of non-volatile memory devices and, more particularly, to a method of operating a non-volatile memory device, in which pass voltages can be set according to program speeds.

There is an increasing demand for non-volatile memory devices that can be electrically programmed and erased and retain data even when power is not supplied. Further, high-integrated technologies of memory cells have been developed in order to develop large-capacity memory devices that are able to store large amounts of data. To this end, a NAND type flash memory device in which a plurality of memory cells is connected in series to form one string and a plurality of strings constitutes one memory cell array was proposed.

In general, a flash memory cell includes a gate in which a tunnel insulating layer, a floating gate, a dielectric layer and a control gate are stacked over a semiconductor substrate, and junctions formed in the semiconductor substrate on both sides of the gate. The flash memory cell is programmed as hot electrons are injected into the floating gate and erased as injected electrons are discharged by Fowler-Nordheim (F-N) tunneling.

FIG. 1A is a view showing the unit string of a flash memory device.

Referring to FIG. 1A, the unit string of a NAND flash memory device includes memory cells MC0, . . . , MC31 connected in series between a drain select transistor DST for selecting a unit string and a source select transistor SST for selecting ground. Each memory cell has a gate in which a floating gate and a control gate are stacked.

The string is connected to a bit line BL. A plurality of structures to which the string and the bit line are connected is connected in parallel to thereby form one block. The blocks are symmetrically arranged on the basis of a bit line contact. The select transistors DST, SST and the memory cells MC0, . . . , MC31 are arranged in matrix form of rows and columns. The gates of the drain select transistor DST and the source select transistor SST arranged in the same column are connected to a drain select line DSL and a source select line SSL, respectively. The gates of the memory cells MC0, . . . , MC31 arranged in the same column are also connected to a plurality of corresponding word lines WL0, . . . , WL31. Further, the drain of the drain select transistor DST is connected to the bit line BL and to the source of the source select transistor SST is connected a common source line CSL.

A program operation of the NAND flash memory device as constructed above is described below.

A program operation is performed by applying 0V to a selected bit line and a program voltage Vpgm to a selected word line such that electrons of a channel area are injected into the floating gate by Fowler-Nordheim (F-N) tunneling, which is generated due to a high voltage difference between the channel area and the control gate of a selected memory cell.

However, the program voltage Vpgm is applied to not only a selected memory cell, but also to unselected memory cells arranged along the same word line, so that the unselected memory cells connected to the same word line are also programmed. This phenomenon is called program disturbance. In order to prevent such program disturbance, a channel voltage Vch of memory cells belonging to the same string is boosted to thereby prevent unselected memory cells from being programmed in such a manner that the source of the drain select transistor DST of a string, including unselected memory cells connected to a selected word line and unselected bit lines, is charged to a level (Vcc-Vth) (where Vcc is a power source voltage and Vth is the threshold voltage of the drain select transistor). The program voltage Vpgm is applied to the selected word, and a pass voltage Vpass is applied to the unselected word lines.

In other words, as shown in FIG. 1A, when the thirtieth word line is selected, if the program voltage Vpgm is applied to the thirtieth word line WL29, the pass voltage Vpass is applied to the remaining word lines, and the drain select transistor DST and the source select transistor SST are turned off, channel boosting is generated. Thus, a channel voltage is raised with a channel being formed, as shown in FIG. 1A, so that unselected memory cells can be prevented from being programmed. To this end, it is necessary to effectively perform channel boosting.

Further, when the number of programmed cells among memory cells constituting a string is many, channel boosting is decreased. To prevent this problem, the following word line voltages can be provided.

FIG. 1B is a view illustrating the supply of voltages to word lines according to an erase area self-boosting (EASB) method of the flash memory device.

FIG. 1B illustrates an EASB method for preventing boosting of programmed cells. In order to implement program inhibition, the twenty-ninth word line WL28, that is, a word line on the SSL line side of the thirtieth word line WL29 for program is turned off in order to form a low channel boosting area between the first word line WL0 and the thirtieth word line WL29 and a high channel boosting area between the thirtieth word line WL29 and the thirty-second word line WL31.

FIG. 1C is a partial enlarged view of FIG. 1B.

FIG. 1C shows an enlarged view of an area 110 of FIG. 1B. As shown in FIG. 1C, as a gate induced drain leakage (GIDL) phenomenon is generated when high channel boosting is generated, the number of electrons created can be increased, and disturbance failure due to hot electrons, which are generated by a strong electronic field caused by a high potential difference, may occur.

FIG. 2 is a graph showing the relationship between a channel boosting level and program disturbance.

From FIG. 2, it can be seen that, when a channel boosting level is low, program disturbance due to F-N tunneling can be generated and, when a channel boosting level is high, program disturbance due to hot electron injection can be generated. Accordingly, there is a need for a method of controlling the pass voltage Vpass applied to the word lines for improved channel boosting.

BRIEF SUMMARY OF THE INVENTION

The present invention is directed towards a method of operating a non-volatile memory device, in which a pass voltage for channel boosting for preventing programming of non-volatile memory can be controlled according to program speeds.

According to a method of operating a non-volatile memory device in accordance with an aspect of the present invention, a first program operation may be performed by applying a first program voltage to word lines of memory cells, constituting a memory block. As a result of the first program operation, threshold voltages of the memory cells are firstly measured. A second program operation may be performed using a second program voltage, which may be different than the first program voltage. For example the second program voltage may be increased as much as a difference between a first threshold voltage, that is, a lowest voltage level of the firstly measured threshold voltages and a second threshold voltage, that is, an intermediate voltage level of the firstly measured threshold voltages. The second program operation may be repeatedly performed by increasing the second program voltage at each iteration. For example, the second program voltage may be increased a fixed amount such as by the difference between the first and second threshold voltages until the lowest threshold voltage becomes higher than a program verify voltage. A pass voltage may be then set by reflecting a first voltage level, that is, a difference between a program voltage applied in a last program execution step and the first program voltage.

The second threshold voltage is a threshold voltage level of most of the memory cells.

The setting of the pass voltage is a result of subtracting the first voltage level from a reference pass voltage set before the first program operation is performed.

After the pass voltage is set, the memory block is erased and the set pass voltage is used in a subsequent operation.

According to a method of operating a non-volatile memory device in accordance with another aspect of the present invention, a standard threshold voltage level of memory cells, constituting a memory block, may be set. A program operation may be performed by applying a first program voltage to word lines of the memory cells. As a result of the program operation, threshold voltages of the memory cells are firstly measured. The middle voltage level of the firstly measured threshold voltages may be set as a representative threshold voltage. A pass voltage may be set by reflecting a voltage difference between the standard threshold voltage level and the representative threshold voltage level.

The representative threshold voltage may be a threshold voltage level of most of the memory cells.

The setting of the pass voltage may be as a result of subtracting the first voltage level from a reference pass voltage set before the program operation is performed.

After the pass voltage is set, the memory block may be erased and the set pass voltage may be used in a subsequent operation.

According to a method of operating a non-volatile memory device in accordance with further another aspect of the present invention, a standard threshold voltage level of memory cells, constituting a memory block, may be set. A program operation may be performed by applying a first program voltage to word lines of the memory cells. As a result of the program operation, threshold voltages of the memory cells are firstly measured. A program voltage difference may be set depending on a voltage difference between the standard threshold voltage level and the representative threshold voltage level. A pass voltage may be set by reflecting the set program voltage difference.

The representative threshold voltage may be a threshold voltage level of most of the memory cells.

The setting of the pass voltage may be a result of subtracting the first voltage level from a reference pass voltage set before the program operation is performed.

After the pass voltage is set, the memory block may be erased and the set pass voltage is used in a subsequent operation.

DESCRIPTION OF SPECIFIC EMBODIMENTS

Now, specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The present invention is defined by the category of the claims.

The present invention relates to the setting of a program speed and pass voltages by associating them, and a principle thereof is described below.

In general, the program speed becomes fast when the coupling ratio is high and when a gap between tunnel oxide, that is, a substrate and a floating gate is thin although the coupling ratio is relatively small. Major factors that increase the program speed and a major factor of channel boosting, that is, a pass voltage have a close relationship.

Thus, when the program speed is fast, a boosting level rises even in the same pass voltage Vpass since the boosting ratio increases. Accordingly, a constant boosting level can be maintained by setting the pass voltage in association with the program speed.

Figure 1A:
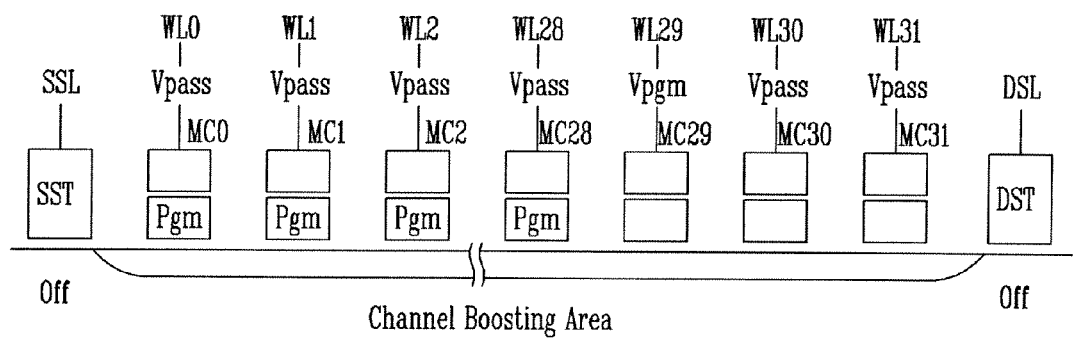
FIG. 1A is a view showing the unit string of a flash memory device.
Figure 1B:
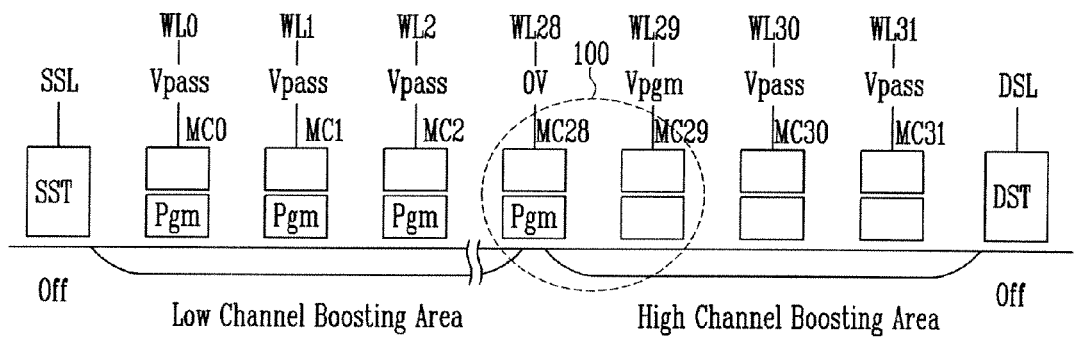
FIG. 1B is a view illustrating the supply of voltages to word lines according to an EASB method of the flash memory device.
Figure 1C:
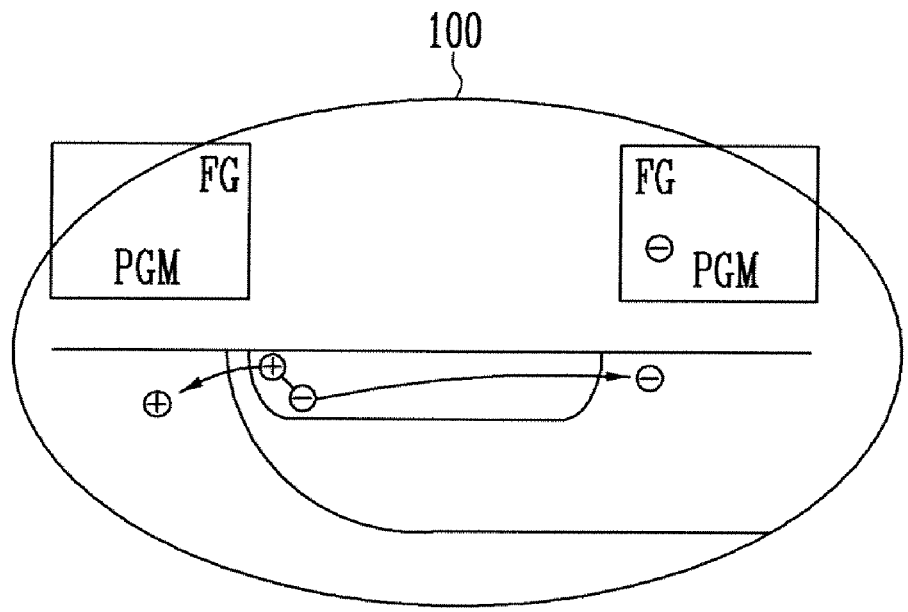
FIG. 1C is a partial enlarged view of FIG. 1B.
Figure 2:
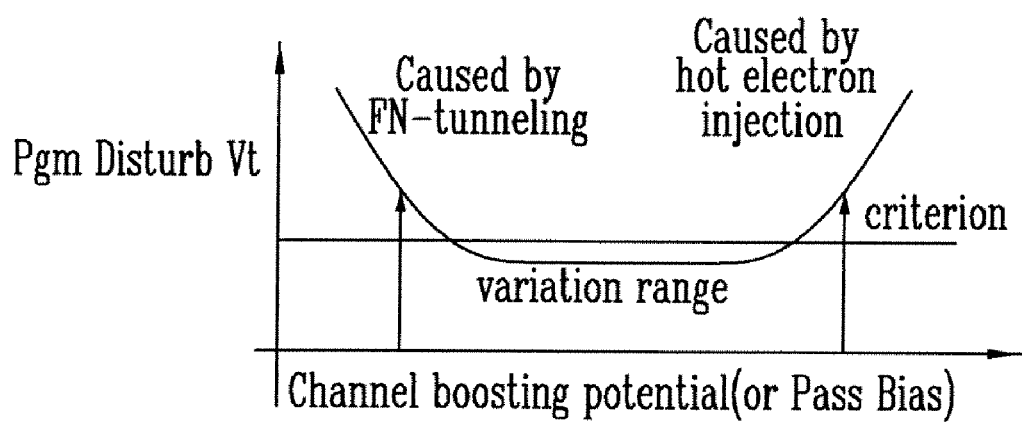
FIG. 2 is a graph showing the relationship between a channel boosting level and program disturbance.
Figure 3:
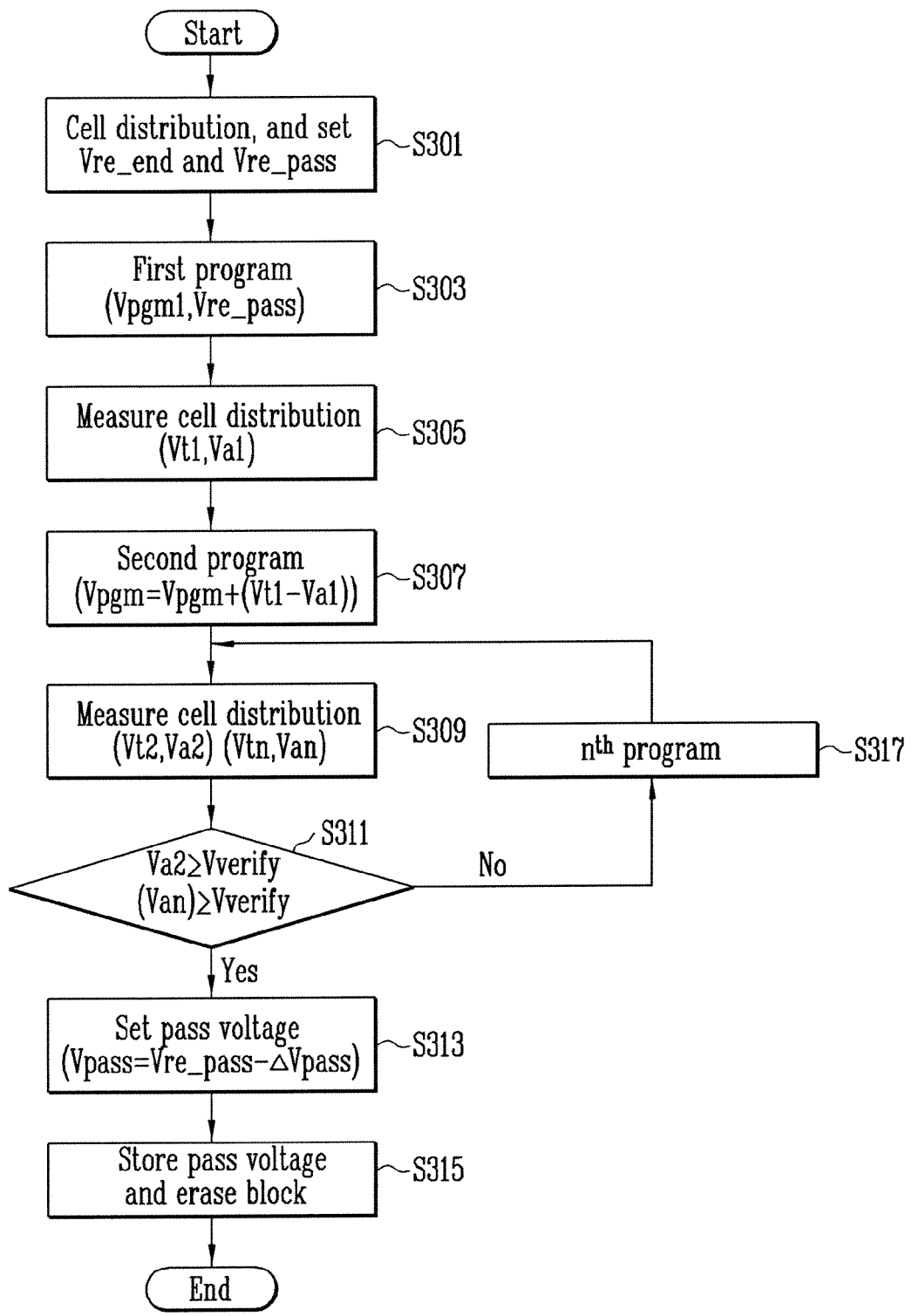
FIG. 3 is a flowchart illustrating a program operation in accordance with a first embodiment of the present invention.

FIG. 3 is a flowchart illustrating a program operation in accordance with an embodiment of the present invention.

Referring to FIG. 3, after the entire distribution of memory cells is set, a program end voltage Vre_end, that is, a reference, and a reference program pass voltage Vre_pass associated with the program end voltage are set at step S301.

Next, a first program is performed on the memory cells using a first program voltage Vpgm1 at step S303. At this time, a first program voltage Vpgm1 is applied to a select word line and the reference program pass voltage Vre_pass is applied to unselect word lines.

After the first program, cell distributions are measured by scanning the threshold voltages of the memory cells at step S305. At this time, the middle threshold voltage level Vt1 and the lowest threshold voltage level Va1, of the threshold voltage distributions, are measured. The threshold voltage Vt1 is a threshold voltage level of a majority of the memory cells.

In this case, the method of measuring the threshold voltages of the memory cells can largely include at least two types. In the first method, it is basically necessary to know the program voltage of a reference memory cell and a threshold voltage of the reference memory cell when being programmed using the corresponding program voltage. In this state, a test memory cell is programmed while raising a program voltage by a step voltage, and a program voltage used to program the test memory cell is measured. Next, the threshold voltage and program voltage of the reference memory cell, and the measured program voltage of the test memory cell are compared to estimate a threshold voltage.

In the second method, it is first necessary basically to know the number of program pulses and a threshold voltage of a reference memory cell, when being fully programmed. A threshold voltage of a memory cell whose threshold voltage will be measured can be estimated by checking the number of program steps before the memory cell has been programmed.

The above methods are now being used and detailed description thereof is omitted.

After the threshold voltages Vt1, Va1 are found, the program voltage is changed to a next program voltage and a second program is then performed at step S307.

A second program voltage for the second program is calculated by the ion.

$$Vpgm2 = Vpgm1 + (Vt1 - Va1) \quad \text{Equation 1}$$

After the second program is performed using the second program voltage Vpgm2, threshold voltages of the memory cells are scanned again. A threshold voltage level Vt2 of a majority of the memory cells and the lowest threshold voltage level Va2, of the scanned threshold voltage distribution, are measured at step S309.

It is then determined whether the threshold voltage level Va2, measured as a result of the second program, is identical to or higher greater than a verify voltage Vverify at step S311. If, as a result of the determination, the threshold voltage level Va2 is identical to or higher greater than the verify voltage Vverify, the second program is stopped and a pass voltage Vpass is set at step S313.

At this time, the pass voltage Vpass can be set by subtracting a voltage difference of the first program voltage Vpgm1 and the program voltage Vpgm2 when the second program is stopped from the reference program pass voltage Vre_pass.

$$\Delta Vpass = \text{Coupling ratio} \times \frac{\Delta Vpgm}{Cr} \quad \text{[Equation 2]}$$

where ΔVpass denotes the change amount of the pass voltage which is reflected in the reference program pass voltage Vre_pass, ΔVpgm is a voltage difference between the first program voltage Vpgm1 and the program voltage Vpgm2 when program is stopped and Cr is a boosting ratio.

Thus, the pass voltage Vpass set in step S313 is calculated by the following Equation.

$$Vpass = Vre\_pass - \Delta Vpass \quad \text{Equation 3}$$

The pass voltage Vpass set as described above is stored for further use and the memory block is erased at step S315. This is because the programming of the memory cells has been performed arbitrarily in order to set the pass voltage in the steps S301 to S313 and, therefore, the memory block is erased after the pass voltage is set so as to erase data that has been arbitrarily programmed.

Further, if, as a result of the determination at step S311, the threshold voltage level Va2 is not identical to or higher my more than the verify voltage Vverify, a next program voltage is set using the threshold voltage Vt2 and the threshold voltage Va2 and a program is performed at step S317. The lowest threshold voltage level is measured using cell distributions and then compared with the verify voltage. This process is repeatedly performed.

Another embodiment for setting a pass voltage is described below.

Figure 4:
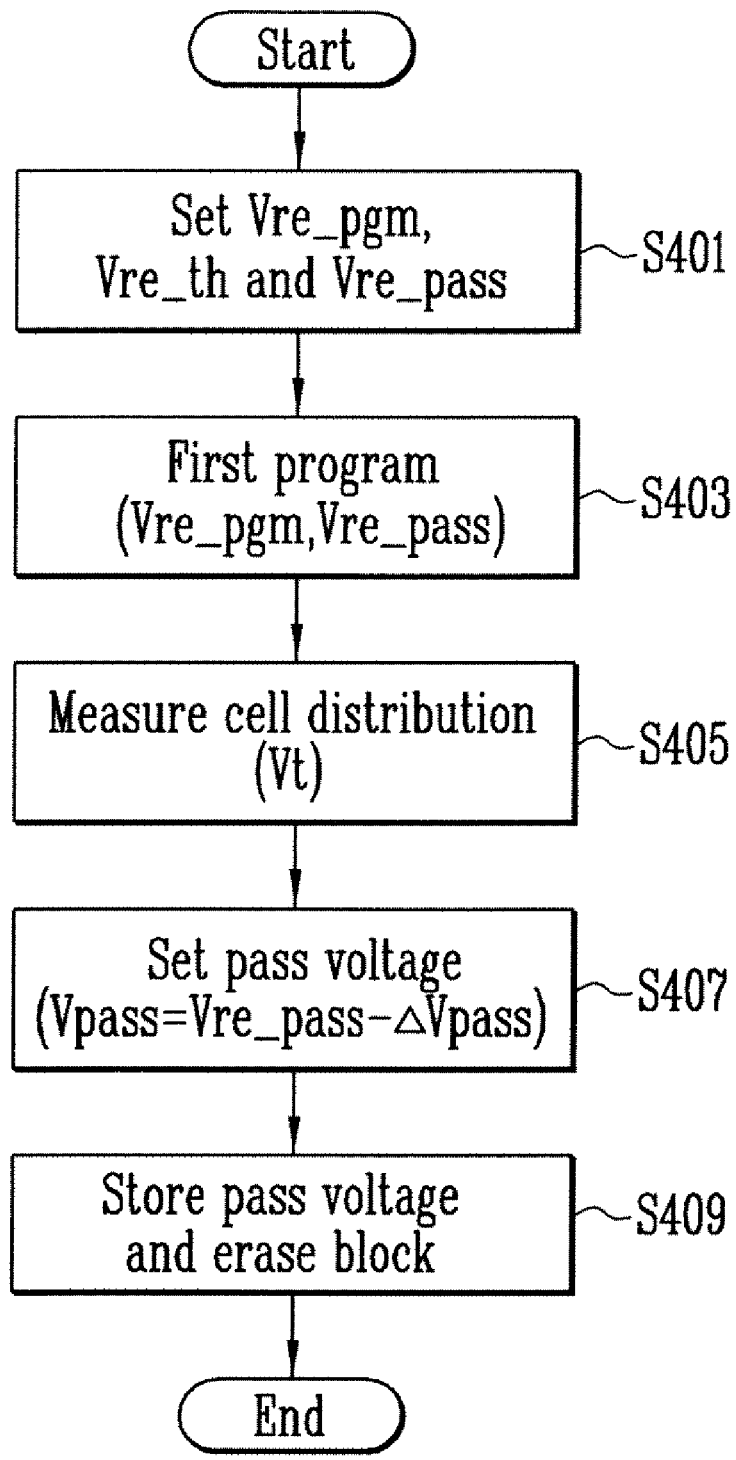
FIG. 4 is a flowchart illustrating a program operation in accordance with a second embodiment of the present invention.

FIG. 4 is a flowchart illustrating a program operation in accordance with a second embodiment of the present invention.

Referring to FIG. 4, first, after the entire distribution of memory cells is set, a reference program voltage Vre_pgm, a reference threshold voltage Vre_th associated with the reference program voltage, and a reference program pass voltage Vre_pass are set at step S401.

Next, a first program is performed on the memory cells using the reference program voltage Vre_pgm at step S403. Here, the reference program voltage Vre_pgm is applied to a selected word line and the reference program pass voltage Vre_pass is applied to unselect word lines.

After the first program, threshold voltages of the memory cells are scanned in order to measure cell distributions Vt at step S405. At this time, a threshold voltage of a majority of the memory cells, of the threshold voltage distribution, is set as a representative threshold voltage Vt1 and a difference between the representative threshold voltage Vt1 and the reference threshold voltage Vre_th is calculated.

The pass voltage Vpass is adjusted by as much as the threshold voltage difference at step S407.

$$Vpass = Vre\_pass - \Delta Vpass = Vre\_pass - (Vre\_th - Vt) \quad \text{Equation 4}$$

The pass voltage Vpass set as described above is stored for future use and the memory block is erased at step S409. This is because the programming of the memory cells has been performed arbitrarily in order to set the pass voltage in the steps S401 to S407 and, therefore, the memory block is erased after the pass voltage is set so as to erase data that has been arbitrarily programmed.

As another alternative embodiment, the pass voltage can be set as follows.

Figure 5:
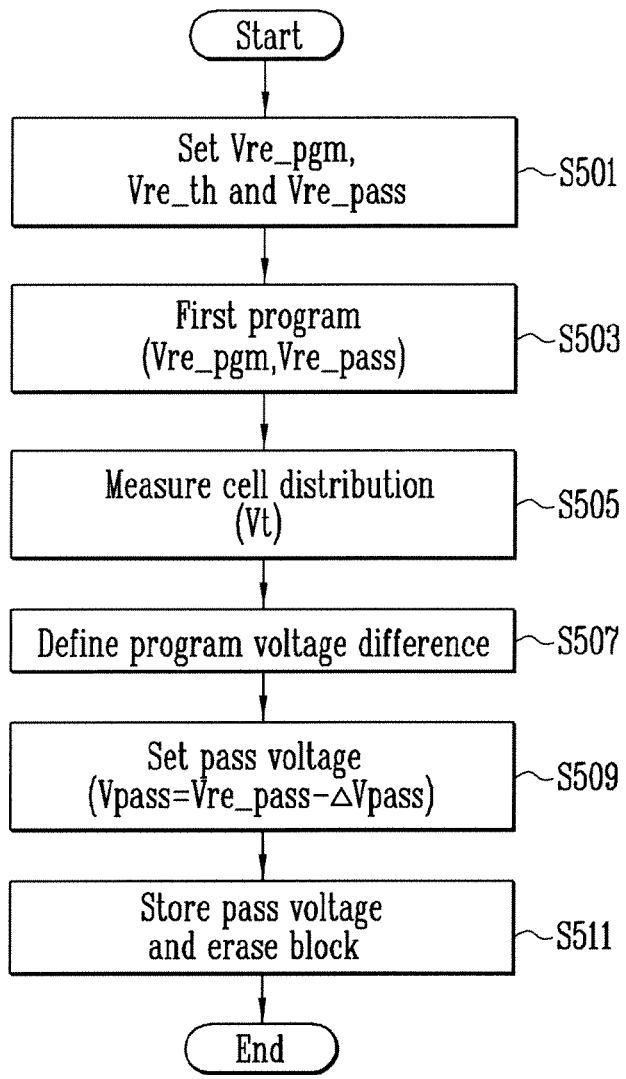
FIG. 5 is a flowchart illustrating a program operation in accordance with a third embodiment of the present invention.

FIG. 5 is a flowchart illustrating a program operation in accordance with a third embodiment of the present invention.

Referring to FIG. 5, after the entire distribution of memory cells is set, a reference program voltage Vre_pgm, a reference threshold voltage Vre_th associated with the reference program voltage, and a reference program pass voltage Vre_pass are set at step S501.

Next, a first program is performed on the memory cells using the reference program voltage Vre_pgm at step S503. Here, the reference program voltage Vre_pgm is applied to a selected word line and the reference program pass voltage Vre_pass is applied to unselect word lines.

After the first program, threshold voltages of the memory cells are scanned in order to measure cell distributions Vt at step S505. At this time, a threshold voltage of a majority of the memory cells, of the threshold voltage distribution, is set as a representative threshold voltage Vt1 and a difference between the representative threshold voltage Vt1 and the reference threshold voltage Vre_th is calculated.

The pass voltage Vpass is defined to be as much as the calculated threshold voltage difference at step S507 and the defined program voltage is reflected in the pass voltage at step S509.

The pass voltage Vpass set as described above is stored for future use and the memory block is then erased at step S509. This is because the programming of the memory cells has been performed arbitrarily in order to set the pass voltage in the steps S501 to S507 and, therefore, the memory block is erased after the pass voltage is set so as to erase data that has been arbitrarily programmed.

According to the first to third embodiments, constant channel boosting can be generated by controlling a pass voltage depending on a program speed of memory cell. Accordingly, the pass voltage setting process can be performed whenever a flash memory device begins driving, so that the pass voltage can be controlled properly.

Figure 6:
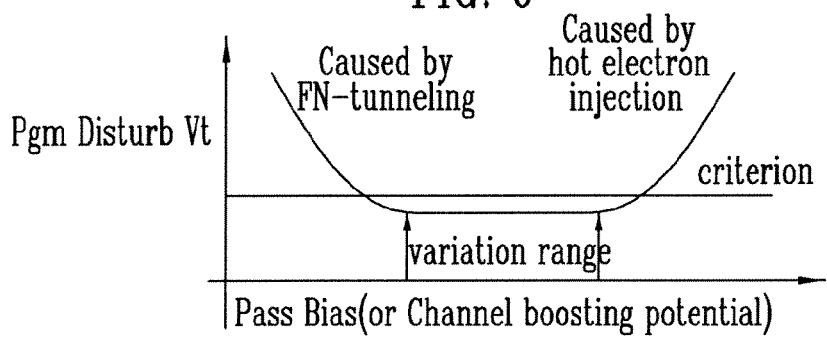
FIG. 6 is a graph showing the relationship between a channel boosting level and program disturbance according to pass voltage setting in accordance with an embodiment of the present invention.

FIG. 6 is a graph showing the relationship between a channel boosting level and program disturbance according to pass voltage setting in accordance with an embodiment of the present invention.

From FIG. 6, it can be seen that, if a program is performed by applying a pass voltage depending on a program speed according to the embodiments of the present invention, a constant channel boosting level can be ensured and a stabilized program characteristic can be obtained.

As described above, according to the method of operating a non-volatile memory device in accordance with embodiments of the present invention, a pass voltage applied to unselect word lines is changed depending on a program speed of a memory cell. Accordingly, channel boosting can be performed effectively.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of operating a non-volatile memory device, the method comprising:
performing a first program operation by applying a first program voltage to word lines of memory cells, constituting a memory block, and measuring threshold voltages of the memory cells as a result of the first program operation;
performing a second program operation using a second program voltage that is increased as much as a difference between a first threshold voltage, that is, a lowest voltage level of the measured threshold voltages and a second threshold voltage, that is, an intermediate voltage level of the measured threshold voltages; and
repeatedly performing the second program operation by increasing the second program voltage by as much as the difference between the first and second threshold voltages until the lowest threshold voltage becomes higher than a program verify voltage, and setting a pass voltage by reflecting a first voltage level, that is, a difference between a program voltage applied in a last program execution step and the first program voltage.

2. The method of claim 1, wherein the second threshold voltage is a threshold voltage level of a majority of the memory cells.

3. The method of claim 1, wherein the setting of the pass voltage is a result of subtracting the first voltage level from a reference pass voltage set before the first program operation is performed.

4. The method of claim 1, wherein after the pass voltage is set, the memory block is erased and the set pass voltage is used in a subsequent operation.

5. A method of operating a non-volatile memory device, the method comprising:
setting a standard threshold voltage level of memory cells, constituting a memory block, performing a program operation by applying a first program voltage to word lines of the memory cells, and measuring threshold voltages of the memory cells as a result of the program operation;
setting a middle voltage level of the measured threshold voltages as a representative threshold voltage; and
setting a pass voltage as a voltage difference between the standard threshold voltage level and the representative threshold voltage level.

6. The method of claim 5, wherein the representative threshold voltage is a threshold voltage level of a majority of the memory cells.

7. The method of claim 5, wherein the setting of the pass voltage is a result of subtracting the first voltage level from a reference pass voltage set before the program operation is performed.

8. The method of claim 5, wherein after the pass voltage is set, the memory block is erased and the set pass voltage is used in a subsequent operation.

9. A method of operating a non-volatile memory device, the method comprising:
setting a standard threshold voltage level of memory cells, constituting a memory block, performing a program operation by applying a first program voltage to word lines of the memory cells, and measuring threshold voltages of the memory cells as a result of the program operation;
setting a middle voltage level of the firstly measured threshold voltages as a representative threshold voltage; and
setting a program voltage difference based upon a voltage difference between the standard threshold voltage level and the representative threshold voltage level and setting a pass voltage based upon the set program voltage difference.

10. The method of claim 9, wherein the representative threshold voltage is a threshold voltage level of a majority of the memory cells.

11. The method of claim 9, wherein the setting of the pass voltage is a result of subtracting the first voltage level from a reference pass voltage set before the program operation is performed.

12. The method of claim 9, wherein after the pass voltage is set, the memory block is erased and the set pass voltage is used in a subsequent operation.

* * * * *